United States Patent
Izumi

(10) Patent No.: US 9,070,474 B2
(45) Date of Patent: Jun. 30, 2015

(54) NONVOLATILE SEMICONDUCTOR MEMORY DEVICE

(71) Applicant: KABUSHIKI KAISHA TOSHIBA, Minato-ku (JP)

(72) Inventor: Tatsuo Izumi, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 159 days.

(21) Appl. No.: 14/019,731

(22) Filed: Sep. 6, 2013

(65) Prior Publication Data

US 2014/0226407 A1 Aug. 14, 2014

Related U.S. Application Data

(60) Provisional application No. 61/764,612, filed on Feb. 14, 2013.

(51) Int. Cl.
G11C 11/34 (2006.01)
G11C 16/06 (2006.01)
G11C 16/34 (2006.01)
G11C 16/16 (2006.01)

(52) U.S. Cl.
CPC .......... *G11C 16/344* (2013.01); *G11C 16/3445* (2013.01); *G11C 16/345* (2013.01); *G11C 16/16* (2013.01)

(58) Field of Classification Search
CPC .... G11C 16/344; G11C 16/16; G11C 16/345; G11C 16/3445

USPC ............. 365/185.22, 185.17, 185.18, 185.19, 365/185.29

See application file for complete search history.

(56) References Cited

U.S. PATENT DOCUMENTS

| | | | |
|---|---|---|---|
| 6,816,411 B2 | 11/2004 | Arai et al. | |
| 7,079,424 B1 * | 7/2006 | Lee et al. | 365/185.29 |
| 8,023,327 B2 | 9/2011 | Futatsuyama | |
| 2012/0206972 A1 * | 8/2012 | Shiino et al. | 365/185.19 |
| 2012/0275232 A1 * | 11/2012 | Park | 365/185.19 |

FOREIGN PATENT DOCUMENTS

| | | |
|---|---|---|
| JP | 2004-185688 | 7/2004 |
| JP | 2010-67327 | 3/2010 |
| JP | 2011-522351 | 7/2011 |
| JP | 2012-511790 | 5/2012 |

* cited by examiner

*Primary Examiner* — Toan Le
(74) *Attorney, Agent, or Firm* — Oblon, McClelland, Maier & Neustadt, L.L.P.

(57) ABSTRACT

An erase verify operation is executed divided into at least a first erase verify operation and a second erase verify operation. The first erase verify operation is an operation that applies a verify read voltage only to a first group of memory cells among the plurality of memory cells included in the NAND cell unit, and applies a first read pass voltage to memory cells other than the first group of memory cells. The second erase verify operation is an operation that applies the verify read voltage to a second group of memory cells different from the first group of memory cells, and applies a second read pass voltage different from the first read pass voltage to memory cells other than the second group of memory cells.

20 Claims, 14 Drawing Sheets

Erase Pulse Application Operation

Erase Verify Operation (1) First Erase Verify Operation

[Erase Verify for
 WL2n (n = 0, 1, 2, ...)]

(2) Second Erase Verify Operation

[Erase Verify for
 WL2n−1 (n = 1, 2, 3, ...)]

NONVOLATILE SEMICONDUCTOR MEMORY DEVICE

CROSS REFERENCE TO RELATED APPLICATIONS

This application is based on and claims the benefit of priority from prior U.S. prior provisional Patent Application No. 61/764,612, filed on Feb. 14 2013, the entire contents of which are incorporated herein by reference.

FIELD

Embodiments described in the present specification relate to a nonvolatile semiconductor memory device.

BACKGROUND

One known example of a conventional nonvolatile semiconductor memory device is a NAND type flash memory. A memory cell array in a NAND type flash memory is configured as an arrangement of a plurality of NAND cell units, each of the NAND cell units having a plurality of memory cells connected in series therein. One NAND cell unit comprises: a memory string configured from the plurality of memory cells connected in series; and select gate transistors connected to both ends of the memory string. A plurality of NAND cell units commonly connected to one word line configures one block which is a smallest unit of an erase operation.

The erase operation in the above-described NAND type flash memory includes an erase pulse application operation for applying an erase pulse to the memory cell, and an erase verify operation for judging whether a certain erase state has been achieved or not. In this erase operation, it is preferable that a threshold voltage distribution indicating the erase state does not shift excessively to a negative side, since such a shift lowers the speed of a write operation next performed. Therefore, a technology for preventing the threshold voltage distribution indicating the erase state from shifting excessively to a negative side is wanted.

DETAILED DESCRIPTION

A semiconductor memory device in an embodiment described below comprises: a memory cell array configured as an arrangement of a plurality of NAND cell units, each of the NAND cell units configured having a plurality of memory cells connected in series therein, each of the memory cells configured capable of storing an erase state where data has been erased from the memory cell and a write state where data has been written to the memory cell; and a control circuit configured to control an operation on the memory cell array.

The control circuit is configured to execute an erase operation that includes: an erase pulse application operation for changing the memory cell from the write state to the erase state; and an erase verify operation for judging whether a plurality of the memory cells are in the erase state or not. The erase verify operation is executed divided into at least a first erase verify operation and a second erase verify operation. The first erase verify operation is an operation that applies a verify read voltage only to a first group of memory cells among the plurality of memory cells included in the NAND cell unit, and applies a first read pass voltage to memory cells other than the first group of memory cells. The second erase verify operation is an operation that applies the verify read voltage to a second group of memory cells different from the first group of memory cells, and applies a second read pass voltage different from the first read pass voltage to memory cells other than the second group of memory cells.

Next, embodiments of the present invention are described in detail with reference to the drawings.

[First Embodiment]

[Schematic Configuration]

Figure 1:
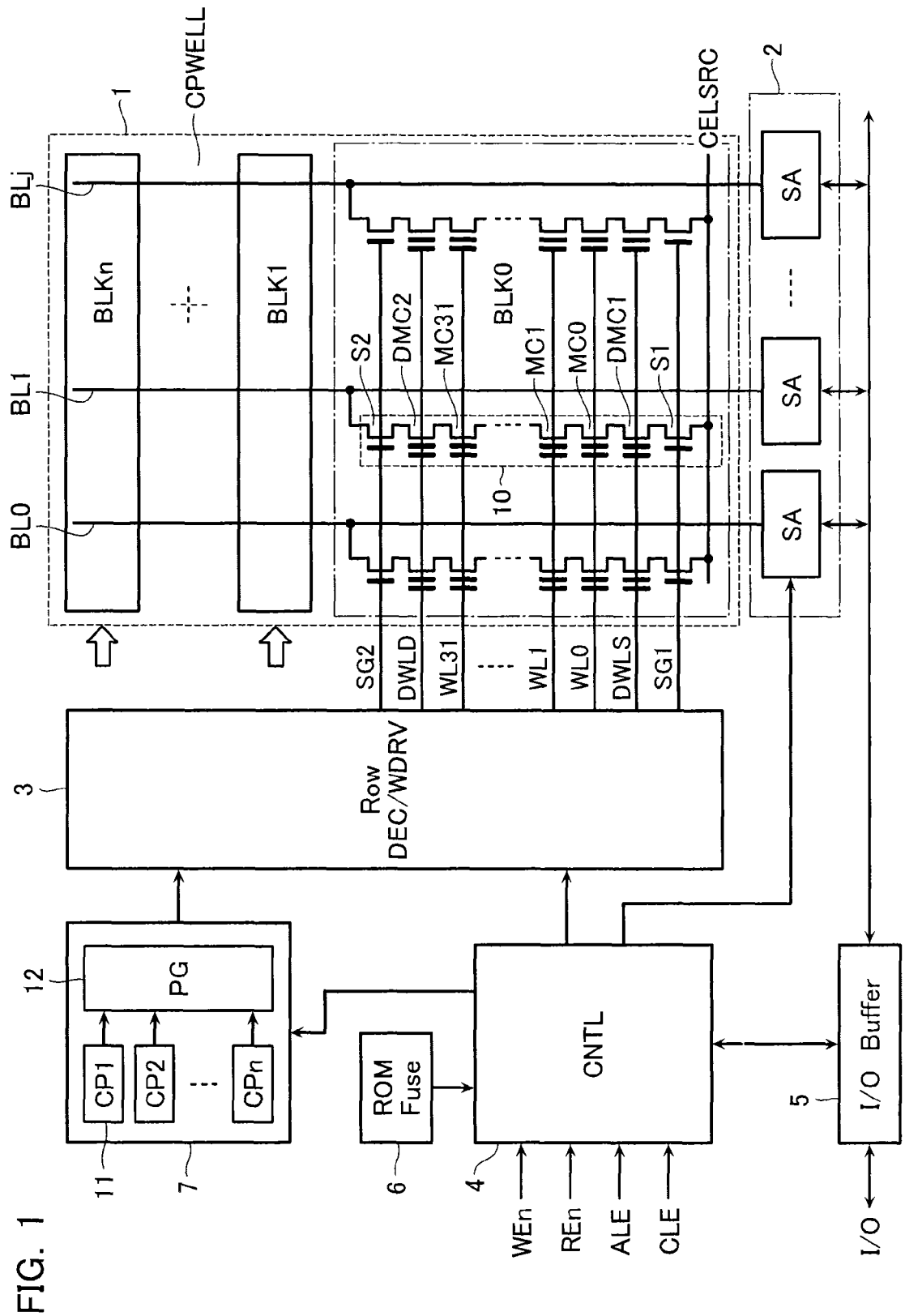
FIG. 1 is a block diagram of a nonvolatile semiconductor memory device (NAND type flash memory) according to a first embodiment.

FIG. 1 is a block diagram of a nonvolatile semiconductor memory device (NAND type flash memory) according to a first embodiment. As shown in FIG. 1, the nonvolatile semiconductor memory device includes a memory cell array 1, a sense amplifier circuit 2, a row decoder 3, a controller 4, an input/output buffer 5, a ROM fuse 6, and a voltage generating circuit 7.

The memory cell array 1 includes a plurality of NAND cell units 10 arranged in a matrix. One NAND cell unit 10 is configured by: a memory string MS configured from a plurality of memory cells MC (MC0, MC1, . . . , MC31) connected in series and dummy cells DMC1 and DMC2; and select gate transistors S1 and S2 connected to both ends of this memory string MS. The memory cell MC is configured capable of storing an erase state where data has been erased from the memory cell MC and a write state where data has been written to the memory cell MC, in a nonvolatile manner, and, as an example, has a floating gate structure that includes a floating gate acting as a charge storage film. Dummy cells DMC1 and DMC2 are positioned at both ends of the memory string MS and have a structure identical to that of the memory cell MC. However, these dummy cells DMC1 and DMC2 are not employed in data storage. Note that the dummy cells DMC1 and DMC2 may be omitted. Moreover, two or more dummy cells may be provided at each end of the memory string MS.

Although not illustrated in the drawings, as is well known, one memory cell MC can be configured to include a floating gate electrode, acting as a charge storage layer, on a gate insulating film (tunnel insulating film) formed between a drain and a source, and to have a control gate electrode formed on that floating gate electrode via an inter-gate insulating film. The control gate is connected to one of word lines WL.

The source of the select gate transistor S1 is connected to a source line CELSRC, and the drain of the select gate transistor S2 is connected to a bit line BL.

Control gates of the memory cells MC in the NAND cell unit 10 are each connected to different word lines WL (WL0, WL1, ..., WL31). Control gates of the dummy cells DMC1 and DMC2 are respectively connected to dummy word lines DWLS and DWLD. Gates of the select gate transistors S1 and S2 are respectively connected to select gate lines SG1 and SG2 that are parallel to the word lines WL. A set of the plurality of memory cells MC sharing one word line WL configures one page or two pages. A set of the plurality of NAND cell units 10 sharing the word lines WL and select gate lines SG1 and SG2 configures a block BLK which is a unit of data erase.

As shown in FIG. 1, the memory cell array 1 includes a plurality of blocks BLK (BLK0, BLK1, ..., BLKn) arranged in a direction of extension of the bit lines BL. The memory cell array 1 including these plurality of blocks BLK is formed in one cell well CPWELL of a silicon substrate.

The sense amplifier circuit 2 is connected to the plurality of bit lines BL in the memory cell array 1. The sense amplifier circuit 2 includes a plurality of sense amplifiers SA. Each of the sense amplifiers SA is connected to a respective one of the bit lines BL, thereby configuring a page buffer for sensing read data and holding write data. The row decoder 3 selects and drives the word lines WL and select gate lines SG1 and SG2.

The data input/output buffer 5, in addition to performing data exchange between the sense amplifier circuit 2 and an external input/output terminal, receives command data and address data. The controller 4 receives an external control signal such as a write enable signal WEn, a read enable signal REn, an address latch enable signal ALE, a command latch enable signal CLE, and so on, to perform overall control of memory operations. Specifically, the controller 4 performs control of a read operation, a write operation, an erase operation, and so on, mentioned later.

Specifically, the controller 4 includes a command interface, address holding/transferring circuit, or the like, and judges whether supplied data is write data or address data. Based on this judgment result, write data is transferred to the sense amplifier circuit 2, and address data is transferred to the row decoder 3 or sense amplifier circuit 2. In addition, the controller 4 performs sequence control of read, write, and erase, control of an applied voltage, and so on, based on an external control signal. Programs for executing these various kinds of operations are built in to the controller 4.

The voltage generating circuit 7 includes a plurality of boost circuits 11 and a pulse generating circuit 12. The boost circuits 11 may each be configured from well-known charge pump circuits CP1, CP2, ..., CPn. Based on a control signal from the controller 4, the voltage generating circuit 7 switches the number of boost circuits 11 that are driven, and further controls the pulse generating circuit 12, thereby generating a desired pulse voltage.

Figure 2:
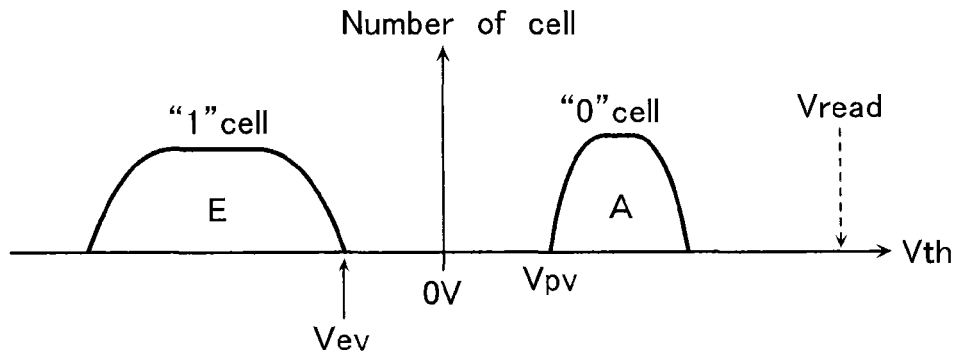
FIG. 2 shows a relationship between data stored in a memory cell MC and threshold voltage distribution.

FIG. 2 shows a relationship between data stored in the memory cell MC and threshold voltage distribution. FIG. 2 shows an example where binary storage is executed. It is of course also possible to adopt a system for storing multiple bits in one memory cell, such as four-value storage, eight-value storage, and so on, in the present embodiment, but since the erase operation is similar in each case, description below proceeds limited to binary storage.

As shown in FIG. 2, when a threshold voltage possessed by a memory cell MC is included in a negative threshold voltage distribution E, that memory cell MC is defined to be a "1" cell holding logical "1" data (erase state). Moreover, when a threshold voltage possessed by a memory cell MC is included in a positive threshold voltage distribution A, that memory cell MC is defined to be a "0" cell holding logical "0" data (write state).

In the present specification, an operation for changing a memory cell MC from a "0" cell (write state) to a "1" cell (erase state) is called an erase operation. Conversely, an operation for changing a memory cell MC from a "1" cell (erase state) to a "0" cell (write state) is called a write operation. Moreover, an operation for reading data stored by a memory cell MC by judging whether a threshold voltage possessed by the memory cell MC belongs to any of a plurality of threshold voltage distributions is defined as a read operation.

In the present specification, "write operation" means an operation that includes: a write pulse application operation that applies a write pulse voltage for increasing a threshold voltage in a positive direction; and a write verify operation for judging whether the write operation has actually been completed by the write pulse application operation or not.

Moreover, in the present specification, "erase operation" means an operation that includes: an erase pulse application operation that applies a memory cell MC with an erase pulse voltage for changing a threshold voltage in a negative direction; and an erase verify operation for judging whether the erase operation has actually been completed by the erase pulse application operation or not. In a NAND type flash memory, an erase operation is normally performed in a block BLK unit. In addition, when it has been judged by the erase verify operation that the erase operation is incomplete, an erase pulse voltage Vera is raised in the next erase pulse application operation higher than in the erase pulse application operation one previous by an amount of a certain step-up value (for example, α). In the present specification, such an operation for raising the erase pulse voltage Vera is called a "step-up operation".

Next, specific methods of the erase pulse application operation and the erase verify operation executed in the erase operation are described with reference to FIGS. 3 and 4.

[Erase Pulse Application Operation]

Figure 3:
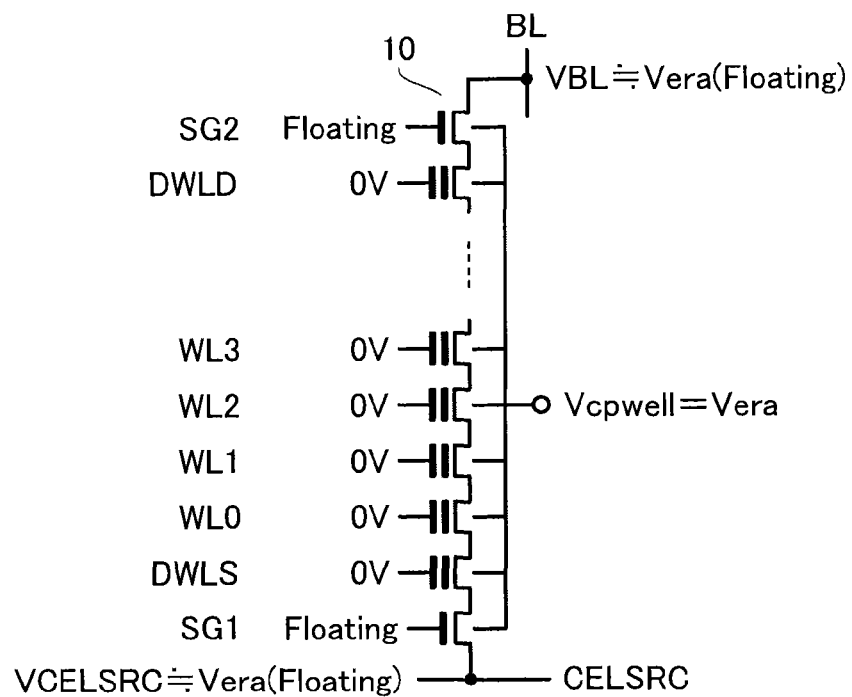
FIG. 3 shows a specific method of an erase pulse application operation and an erase verify operation.

FIG. 3 shows an example of a relationship of potentials during an erase pulse application operation focused on one NAND cell unit 10. The erase pulse application operation is executed in a block BLK unit. A voltage Vpwell of the cell well CPWELL of the memory cells MC is set to an erase pulse voltage Vera (about 20~25 V), and a voltage of all the word lines WL and the dummy word lines DWLD and DWLS in a selected block BLK (hereinafter, selected block BLK) is set to 0 V. As a result, an FN tunnel current is generated, electrons in the floating gates of each of the memory cells MC are drawn away to a cell well CPWELL side, and the threshold voltage of the memory cells MC lowers. At this time, the select gate lines SG1 and SG2 are set to a floating state in order to prevent a gate oxide film of the select gate transistors S1 and S2 from being destroyed.

In addition, the bit line BL and the source line CELSRC are also set to a floating state. Note that, as mentioned later, the erase pulse voltage Vera is raised in increments of a step voltage α, according to a result of the erase verify operation after the erase pulse application operation. Moreover, a erase pulse application operation is executed again using a voltage Vera+α after that step-up.

[Erase Verify Operation]

Figure 4:
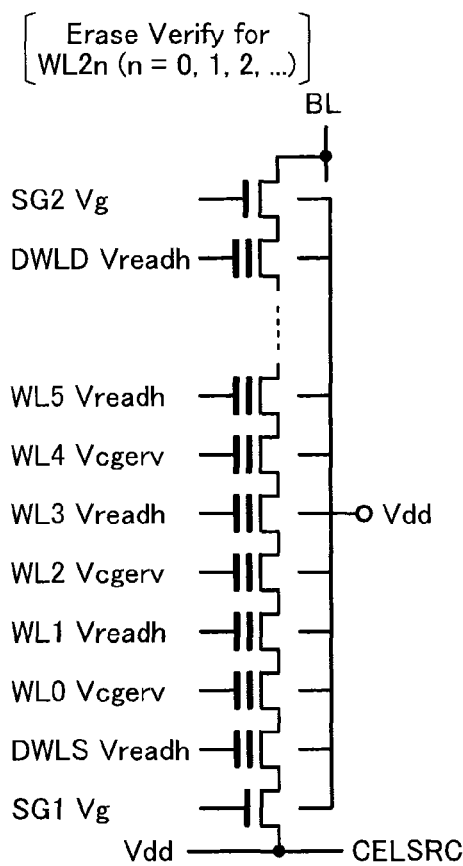
FIG. 4 shows a specific method of an erase pulse application operation and an erase verify operation.
Figure 4:
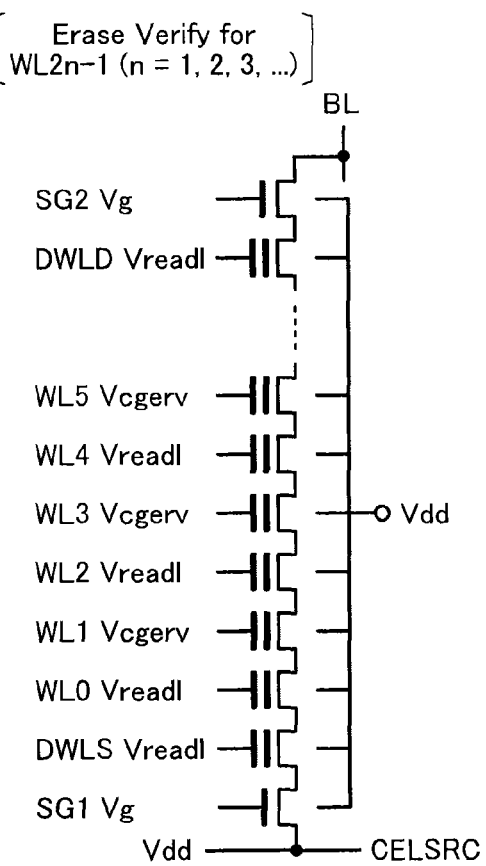

An example of a relationship of voltages applied to the NAND cell unit 10 during the erase verify operation is shown in FIG. 4.

In this embodiment, the erase verify operation is executed divided into a first erase verify operation and a second erase verify operation.

In the first erase verify operation, the word lines WL2$n$ ($n$=0, 1, 2, . . . ) that are even-numbered counting from a bit line BL side are applied with an erase verify voltage Vcgerv (0~1 V), and the word lines WL2$n$−1 ($n$=1, 2, 3, . . . ) that are odd-numbered counting from the bit line BL side and the dummy word lines DWLD and DWLS are applied with a read pass voltage Vreadh. The read pass voltage Vreadh is a voltage capable of rendering the memory cell MC conductive regardless of a data holding state of the memory cell MC, and is a voltage larger than Vcgrv. That is, the erase verify operation is executed targeting only even-numbered memory cells MC. The source line CELSRC and the cell well CPWELL are applied with a power supply voltage Vdd. The select gate lines SG1 and SG2 are applied with a voltage Vg slightly higher than the power supply voltage Vdd. In this state, a voltage of the bit line BL differs according to whether the even-numbered memory cells MC in the NAND cell unit 10 have all been erased to "1" state or not. Therefore, detecting by means of the sense amplifier circuit 2 whether a current is flowing in the NAND cell unit 10 it is judged whether all of the memory cells MC in one NAND cell unit are in an erase state or not.

On the other hand, in the second erase verify operation, the word lines WL2$n$−1 ($n$=1, 2, 3, . . . ) that are odd-numbered counting from the bit line BL side and that were not targeted in the first erase verify operation are applied with the erase verify voltage Vcgerv. The word lines WL2$n$ ($n$=0, 1, 2, . . . ) that are even-numbered counting from the bit line BL side and the dummy word lines DWLD and DWLS are applied with a read pass voltage Vreadl. That is, in this second erase verify operation, the erase verify operation is executed targeting only odd-numbered memory cells MC that were not made a verify operation target in the first erase verify operation. The read pass voltage Vreadl, similarly to the read pass voltage Vreadh, is a voltage capable of rendering the memory cell MC conductive regardless of a data holding state of the memory cell MC. However, the voltage Vreadl is a voltage slightly smaller than Vreadh. As an example, Vreadh is about 7 V, and Vreadl is set at about 6 V, which is smaller than 7 V by 1 V. The difference between Vreadh and Vreadl affects speed of the erase operation and width of the threshold voltage distribution after the erase operation, hence is set to an appropriate value according to required speed of the erase operation and width of the threshold voltage distribution.

In the present embodiment, as described above, the erase verify operation is executed divided into the first erase verify operation targeting even-numbered memory cells and the second erase verify operation targeting odd-numbered memory cells. Reducing the number of memory cells targeted by the erase verify operation in this way makes a judgment condition of erase completion less strict and enables excessive shifting of the negative threshold voltage distribution E in a negative direction to be suppressed.

Moreover, in the present embodiment, the read pass voltage Vreadh in the first erase verify operation is set higher compared to the read pass voltage Vreadl in the second erase verify operation. This is done for the following reason. Since the first erase verify operation employs the read pass voltage Vreadh which is slightly larger than the read pass voltage Vreadl, an erase judgment condition of the first erase verify operation is less strict compared to that of the second erase verify operation. Therefore, it is more frequently judged in the second erase verify operation that the erase operation of odd-numbered memory cells is incomplete, even when it has been judged by the first erase verify operation that the erase operation of even-numbered memory cells MC has been completed. Judgment results differing between the first erase verify operation and the second erase verify operation in this way indicates that the erase operation is approaching completion. After it has been judged that the erase operation is approaching completion, excessive shifting of the negative threshold voltage distribution E in a negative direction can be suppressed by adjusting various kinds of voltage values, and so on.

Figure 5:
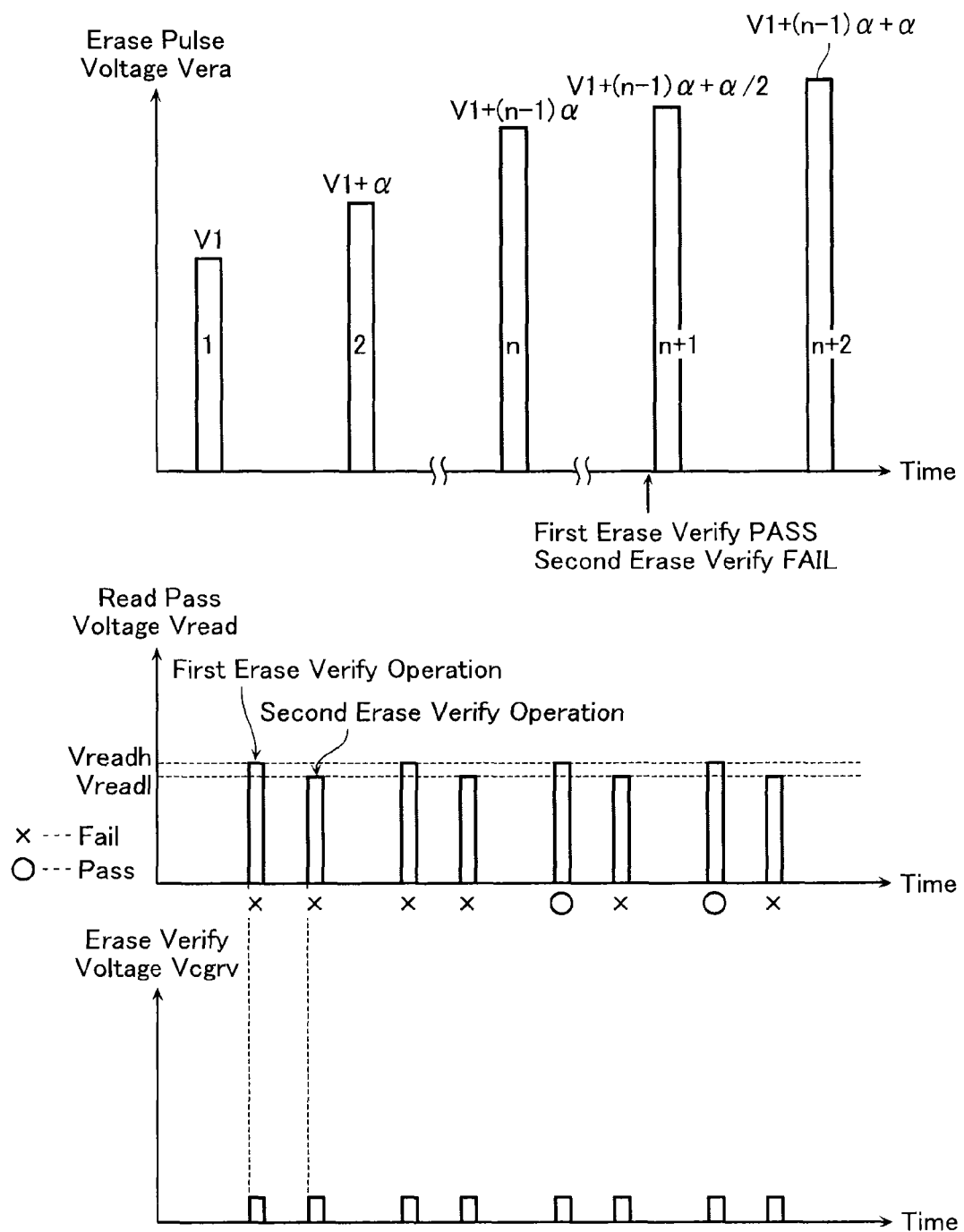
FIG. 5 is a graph showing a specific procedure of an erase operation according to the first embodiment.

Next, a specific procedure of the erase operation according to the present embodiment is described in detail with reference to graphs of FIG. 5 and a flowchart of FIG. 6. The graphs of FIG. 5 show changes in the erase pulse voltage Vera, the read pass voltage Vread, and the erase verify voltage Vcgrv applied in the erase pulse application operation and the erase verify operation. Moreover, FIG. 6 is a flowchart showing a procedure of operation when performing the erase pulse application operation and the erase verify operation.

Figure 6:
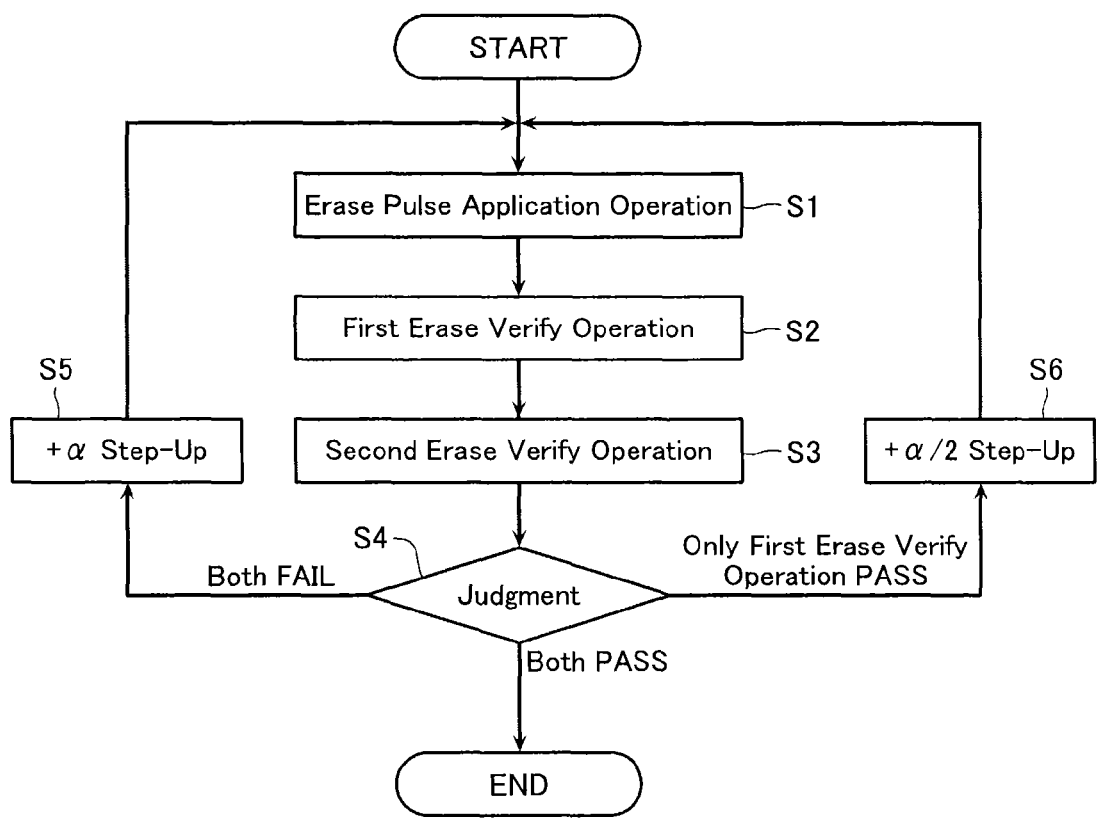
FIG. 6 is a flowchart showing a specific procedure of an erase operation according to the first embodiment.

As shown in FIG. 6, first, when the erase operation is started, an initial erase pulse voltage Vera is applied (S1). An initial value of this erase pulse voltage Vera is V1. Then, in order to judge whether application of this erase pulse voltage Vera=V1 has resulted in the erase operation being completed or not, the first erase verify operation and the second erase verify operation are executed (S2 and S3). The read pass voltage in the first erase verify operation is Vreadh, and the read pass voltage in the second erase verify operation is Vreadl which is lower than Vreadh.

Then, judgment results of these first erase verify operation and second erase verify operation are judged (S4). When it is judged in both the first erase verify operation and the second erase verify operation that the erase operation is incomplete (Fail), an erase pulse application operation is executed again (S1), but the erase pulse voltage Vera at that time is set not to the former value V1 but to a value stepped up from V1 by an amount of a voltage α (S5: step-up operation). As shown in FIG. 5, as long as the judgment result of the first erase verify operation and the judgment result of the second erase verify operation both continue to be "Fail", a step-up width is maintained unchanged at the voltage α.

On the other hand, when the first erase verify operation judges the erase operation to be completed (Pass) while it is judged in the second erase verify operation that the erase operation is incomplete (Fail), a step-up operation of the erase pulse voltage Vera for the next erase pulse application operation is similarly performed. However, since the erase operation is approaching completion, the step-up width is set not to the voltage α but to a value smaller than this of, for example, α/2 (S6). FIG. 5 illustrates by example the case where, after n times of the erase pulse application operation, the first erase verify operation judges the erase operation to be completed (Pass) while it is judged in the second erase verify operation that the erase operation is incomplete (Fail). The erase pulse application operation and the erase verify operation are thus repeated and when it is judged in both the first erase verify operation and the second erase verify operation that the erase operation is completed (Pass), the erase operation finishes (END).

Figure 7:
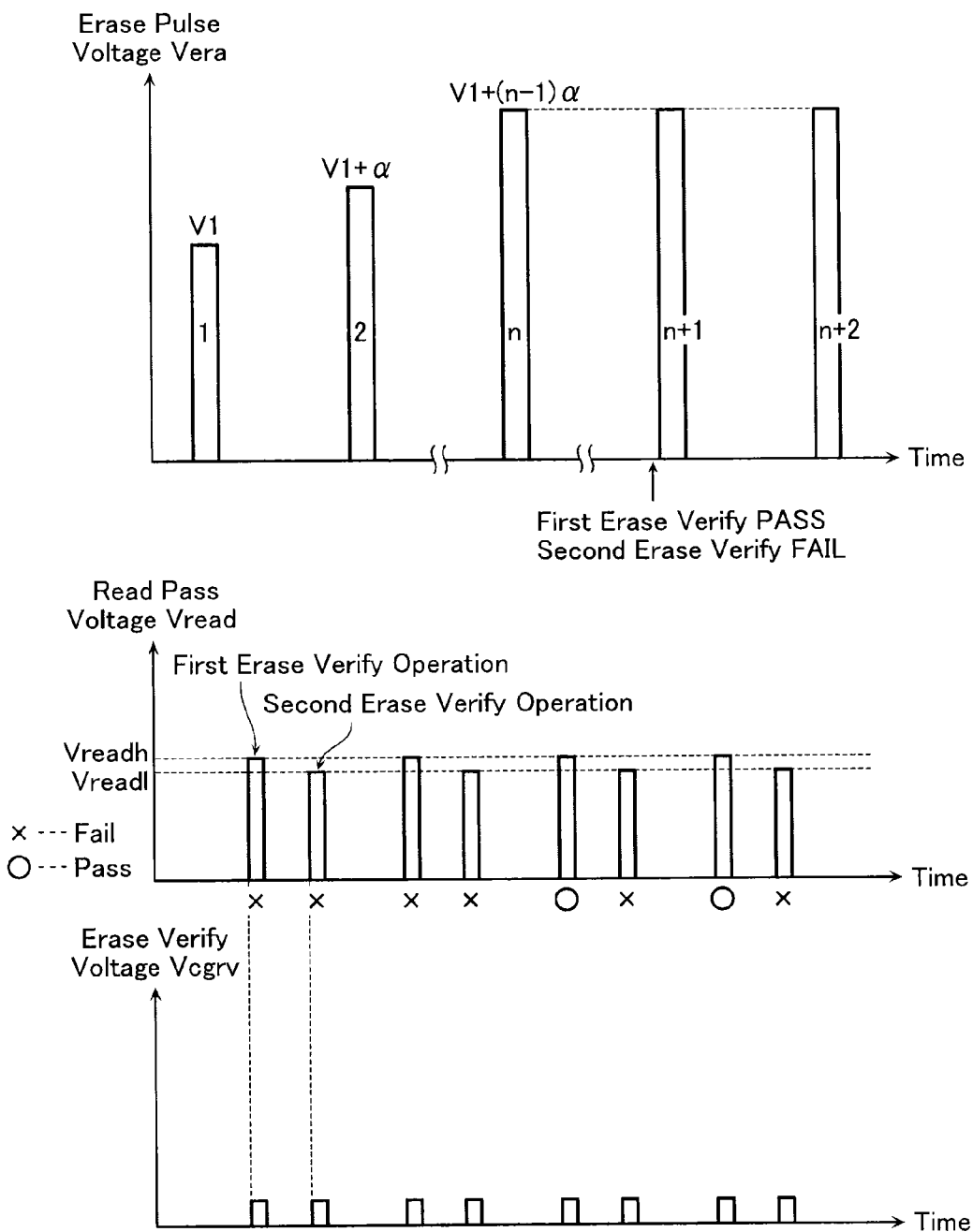
FIG. 7 is a graph showing a specific procedure of an erase operation according to the first embodiment.

Note that, as shown in FIG. 7, when the first erase verify operation judges the erase operation to be completed (Pass) while it is judged in the second erase verify operation that the erase operation is incomplete (Fail), it is also possible to set the step-up width to zero (no step-up), instead of to a small value.

Note that in the above-described embodiment, in order to reduce time of the erase operation, when it is judged in the erase verify operation that, of M NAND cell units 10 in one block, the number $N_{NG}$ of those NAND cell units where erase has not been completed has become less than or equal to a certain allowed number $N_{AL}$, the erase operation can be finished, assumed to have been completed (pseudo pass system). This applies also to other embodiments described below.

[Second Embodiment]

Figure 8:
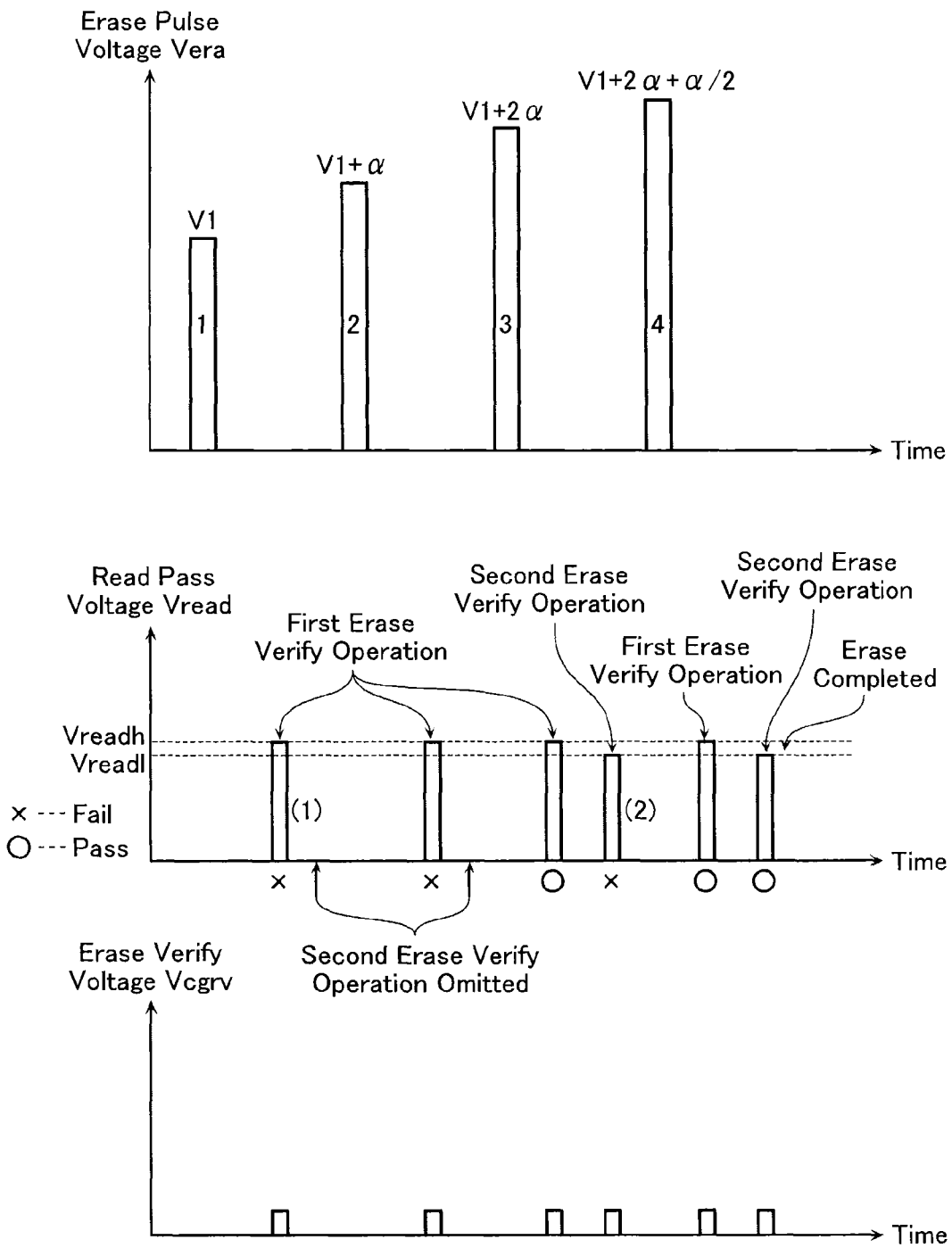
FIG. 8 is a graph showing a specific procedure of an erase operation according to a second embodiment.

Next, a nonvolatile semiconductor memory device according to a second embodiment is described with reference to FIGS. 8~9. A configuration of the nonvolatile semiconductor memory device in this embodiment may be similar to that of FIG. 1. However, in this embodiment, a specific procedure of the erase operation is different, hence content of a program related to the erase operation built in to the controller 4 is different.

In this second embodiment, similarly to in the first embodiment, the erase verify operation is executed divided into the first erase verify operation and the second erase verify operation. Similarly to in the first embodiment, the first erase verify operation is an erase verify operation targeting memory cells that are even-numbered counting from the bit line BL side, while the second erase verify operation is an erase verify operation targeting memory cells that are odd-numbered counting from the bit line BL side.

However, in this second embodiment, when the first erase verify operation is performed and the judgment result of that first erase verify operation is "Fail", the second erase verify operation is omitted. The first erase verify operation has less strict conditions for judging completion of the erase operation than the second erase verify operation. Therefore, when "Fail" is judged in the first erase verify operation, there is a high possibility that in almost all cases "Fail" will be judged also in the second erase verify operation. As a result, in the above case of "Fail" being judged in the first erase verify operation, the second erase verify operation is omitted.

The specific procedure of the erase operation in the second embodiment is described with reference to graphs of FIG. 8 and a flowchart of FIG. 9.

Figure 9:
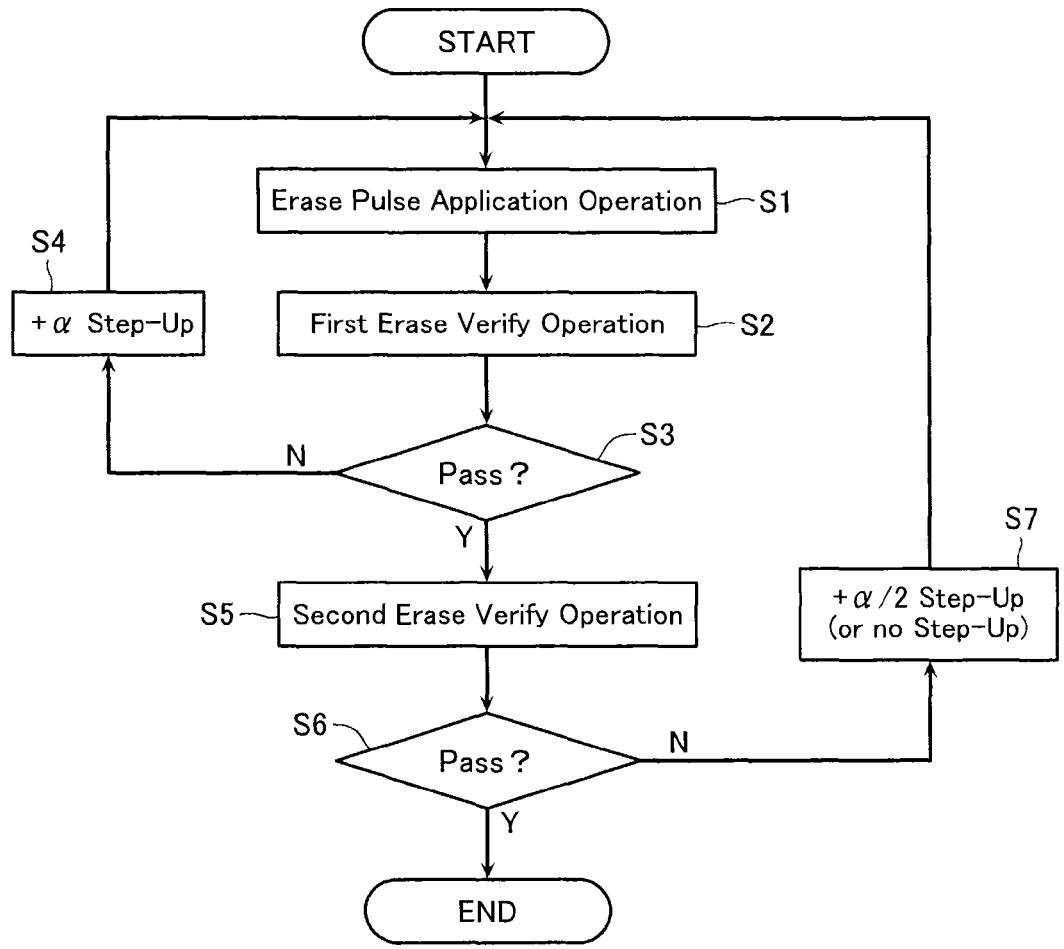
FIG. 9 is a flowchart showing a specific procedure of an erase operation according to the second embodiment.

As shown in FIG. 9, first, when the erase operation is started, an initial erase pulse voltage Vera is applied (S1). An initial value of this erase pulse voltage Vera is V1. After the erase pulse application operation using this erase pulse voltage Vera=V1, the first erase verify operation is executed in order to judge whether the erase operation has been completed or not (S2, (1) in FIG. 8).

Then, a judgment result of this first erase verify operation is outputted (S3). When it is judged by the first erase verify operation that the erase operation is incomplete (Fail), an erase pulse application operation is executed again (S1) without shifting to the second erase verify operation, but the erase pulse voltage Vera at that time is set not to the former value V1 but to a value stepped up from V1 by an amount of a voltage α (S4: step-up operation).

On the other hand, when the first erase verify operation judges the erase operation to be completed (Pass), the second erase verify operation is executed (S5: (2) in FIG. 8). In other words, in this embodiment, as long as the judgment result of the first erase verify operation does not achieve "Pass", the second erase verify operation is not performed. FIG. 8 illustrates by way of example the case where the first erase verify operation has judged "Fail" after a first time and a second time of the erase pulse application operation, and accordingly, the second erase verify operation is not performed (is omitted).

When a judgment result of the second erase verify operation is "Pass", the erase operation finishes (END). On the other hand, when the judgment result of the second erase verify operation is "Fail", the step-up width in the step-up operation is set not to the voltage α but to a value smaller than this of, for example, α/2 (S7). Alternatively, the step-up width is set to zero (no step-up).

This second embodiment also allows similar advantages to those of the first embodiment to be displayed. In addition, because the second erase verify operation is omitted according to the result of the first erase verify operation, this second embodiment enables time required for the erase operation to be reduced compared to the first embodiment.

[Third Embodiment]

Next, a nonvolatile semiconductor memory device according to a third embodiment is described with reference to FIGS. 10~11. A configuration of the nonvolatile semiconductor memory device in this embodiment may be similar to that of FIG. 1. However, in this embodiment, a specific procedure of the erase operation is different, hence content of a program related to the erase operation built in to the controller 4 is different.

In this third embodiment, similarly to in the first embodiment, the erase verify operation is executed divided into the first erase verify operation and the second erase verify operation. Similarly to in the first embodiment, the first erase verify operation is an erase verify operation targeting memory cells that are even-numbered counting from the bit line BL side, while the second erase verify operation is an erase verify operation targeting memory cells that are odd-numbered counting from the bit line BL side.

In this third embodiment, similarly to in the first embodiment, after execution of a first time of the erase pulse application operation, the first erase verify operation and the second erase verify operation are executed sequentially. Moreover, when the judgment result of the first erase verify operation is "Pass" and the judgment result of the second erase verify operation is "Fail", the step-up width of the voltage Vera in the next erase pulse application operation is reduced or set to zero (no step-up). This is similar to in the first embodiment.

Figure 10:
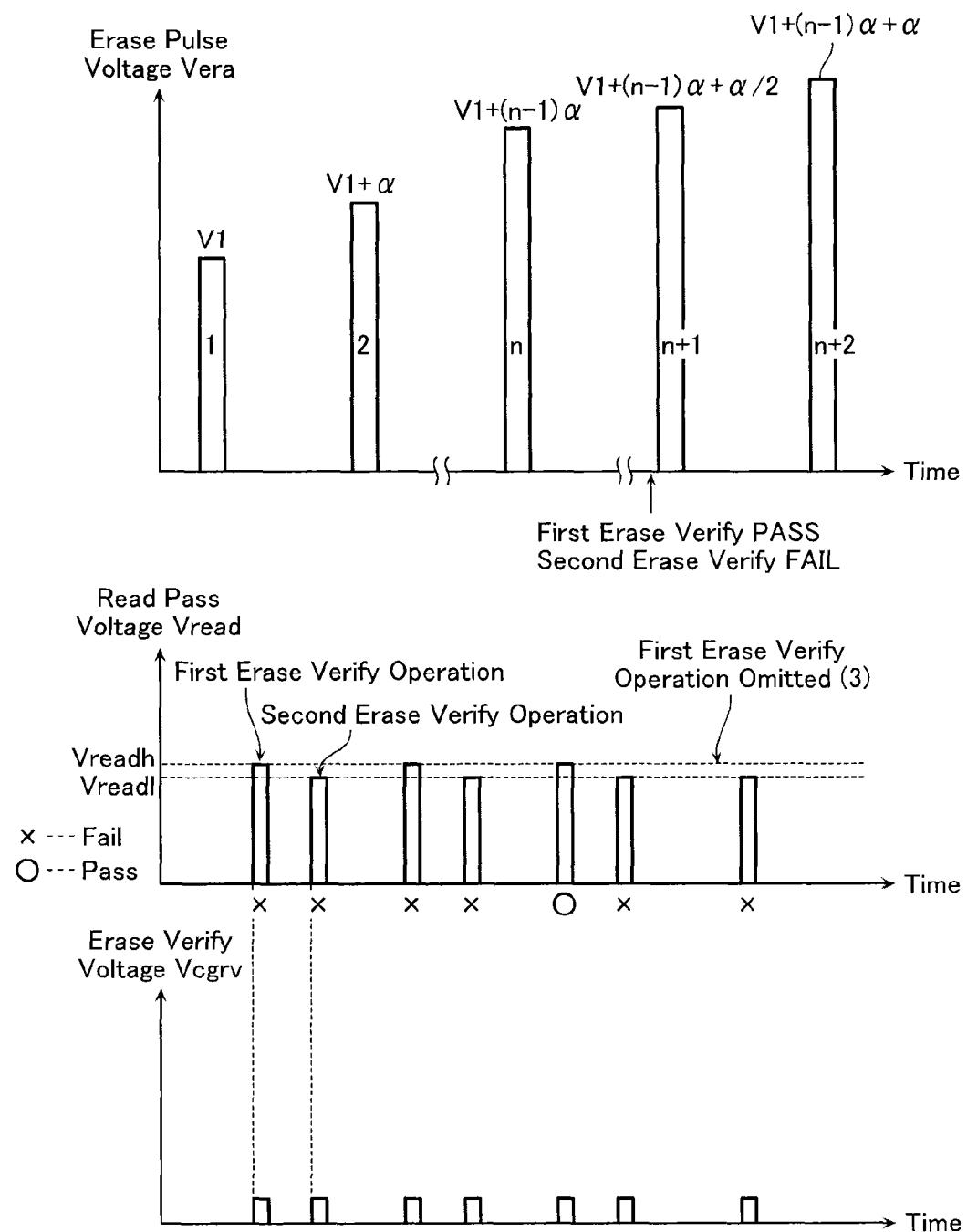
FIG. 10 is a graph showing a specific procedure of an erase operation according to a third embodiment.
Figure 11:
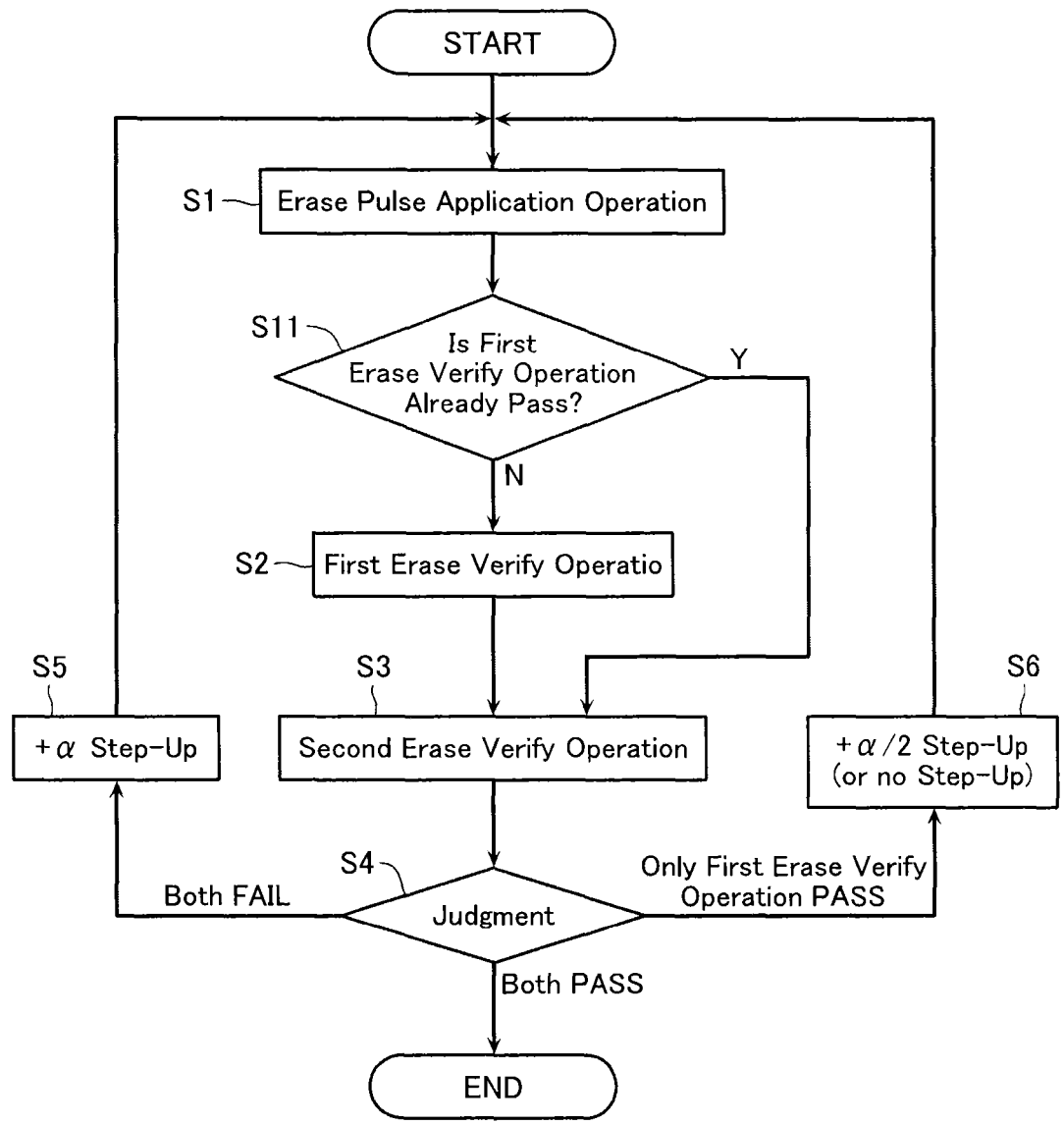
FIG. 11 is a flowchart showing a specific procedure of an erase operation according to the third embodiment.

However, in this embodiment, from the next erase verify operation, when the judgment result of the first erase verify operation is "Pass" and the judgment result of the second erase verify operation is "Fail", in the next erase verify operation, the first erase verify operation is omitted and only the second erase verify operation is performed ((3) in FIG. 10). This is different from the first embodiment.

Next, the specific procedure of the erase operation in the third embodiment is described with reference to graphs of FIG. 10 and a flowchart of FIG. 11.

As shown in FIG. 10, first, when the erase operation is started, an initial erase pulse voltage Vera is applied (S1). An initial value of this erase pulse voltage Vera is V1. Then, in order to judge whether application of this erase pulse voltage Vera=V1 has resulted in the erase operation being completed or not, the first erase verify operation and the second erase verify operation are executed (S2 and S3).

Then, judgment results of these first erase verify operation and second erase verify operation are judged (S4). When it is judged in both the first erase verify operation and the second erase verify operation that the erase operation is incomplete (Fail), an erase pulse application operation is executed again (S1), but the erase pulse voltage Vera at that time is set not to the former value V1 but to a value stepped up from V1 by an amount of a voltage α (S5: step-up operation).

On the other hand, when the first erase verify operation judges the erase operation to be completed (Pass) while it is judged in the second erase verify operation that the erase operation is incomplete (Fail), the step-up width is set not to the voltage α but to a value smaller than this of, for example, α/2 (S6). Alternatively, the step-up width is set to zero (no step-up). Moreover, in subsequent erase verify operations, since the first erase verify operation has already achieved Pass, the first erase verify operation is omitted and only the second erase verify operation is executed (S11).

FIG. 10 illustrates by example the case where, after n times of the erase pulse application operation, the first erase verify operation judges the erase operation to be completed (Pass) while it is judged in the second erase verify operation that the erase operation is incomplete (Fail). Then, after the (n+1)-th time of the erase pulse application operation, the first erase verify operation is omitted and only the second erase verify operation is executed.

This third embodiment also allows similar advantages to those of the first embodiment to be displayed. In addition, because the first erase verify operation is omitted according to the result of the erase verify operation, this third embodiment enables time required for the erase operation to be reduced compared to the first embodiment.

[Fourth Embodiment]

Next, a nonvolatile semiconductor memory device according to a fourth embodiment is described with reference to FIGS. 12~13. A configuration of the nonvolatile semiconductor memory device in this embodiment may be similar to that of FIG. 1. However, in this embodiment, a specific procedure of the erase operation is different, hence content of a program related to the erase operation built in to the controller 4 is different.

In this fourth embodiment, similarly to in the first embodiment, the erase verify operation is executed divided into the first erase verify operation and the second erase verify operation.

However, in this fourth embodiment, when the first erase verify operation is performed and the judgment result of that first erase verify operation is "Fail", the second erase verify operation is omitted. This closely resembles the second embodiment. However, in the fourth embodiment, when the first erase verify operation judges the erase operation to be completed (Pass) while it is judged in the second erase verify operation that the erase operation is incomplete (Fail), in the next erase verify operation, the first erase verify operation is omitted and only the second erase verify operation is executed. This is different from the second erase verify operation.

The specific procedure of the erase operation in the fourth embodiment is described with reference to graphs of FIG. 12 and a flowchart of FIG. 13.

Figure 12:
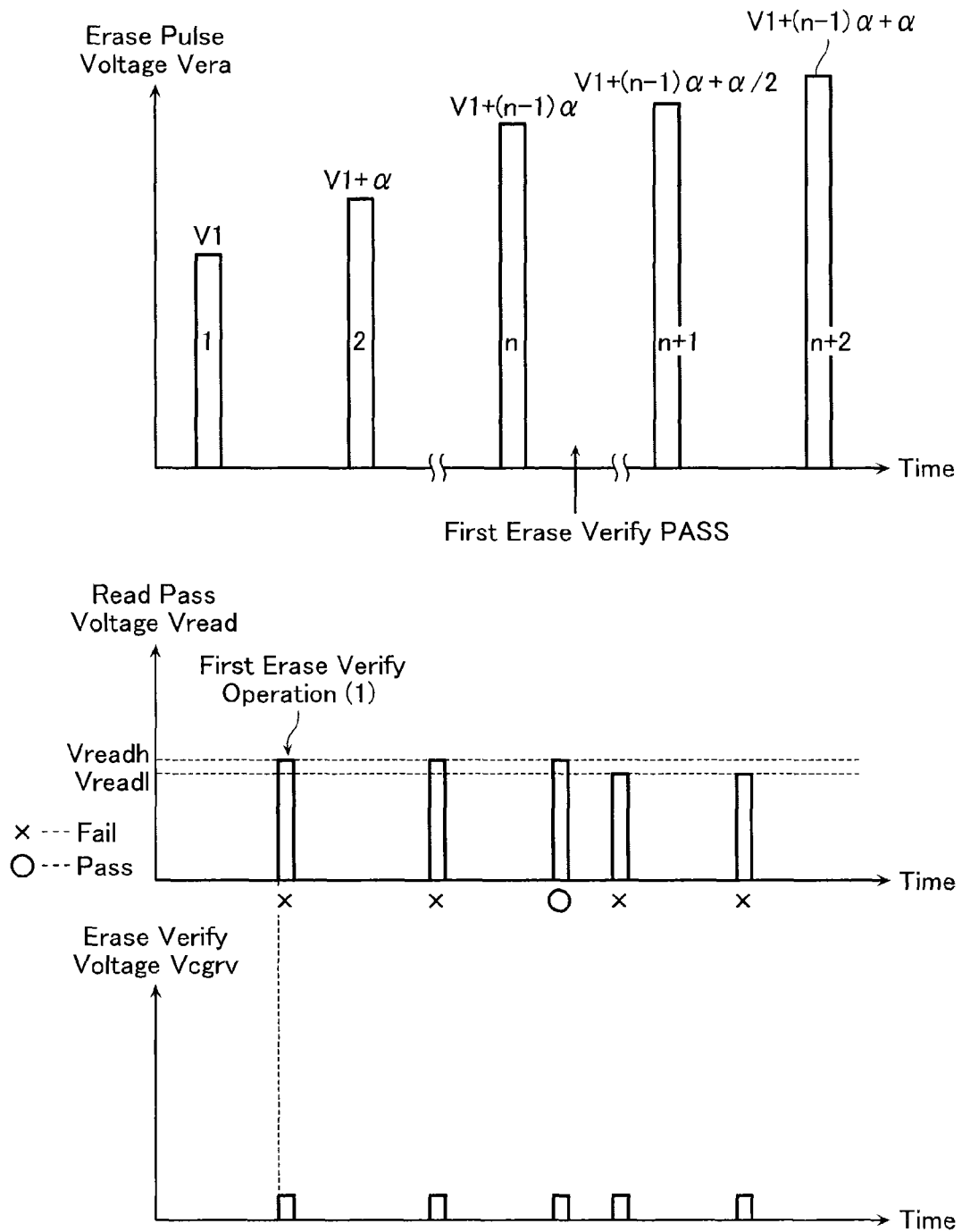
FIG. 12 is a graph showing a specific procedure of an erase operation according to a fourth embodiment.
Figure 13:
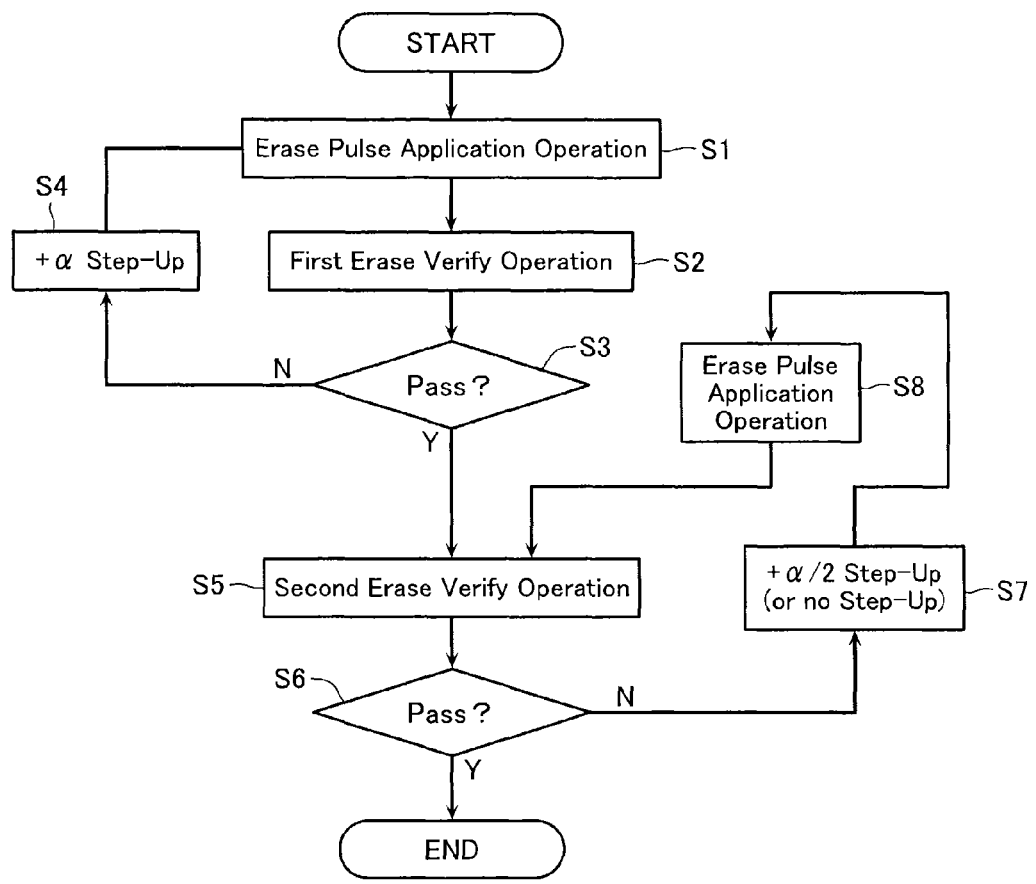
FIG. 13 is a flowchart showing a specific procedure of an erase operation according to the fourth embodiment.

As shown in FIG. 12, first, when the erase operation is started, an initial erase pulse voltage Vera is applied (S1). An initial value of this erase pulse voltage Vera is V1. After the erase pulse application operation using this erase pulse voltage Vera=V1, the first erase verify operation is executed in order to judge whether the erase operation has been completed or not (S2, (1) in FIG. 12).

Then, a judgment result of this first erase verify operation is outputted (S3). When it is judged by the first erase verify operation that the erase operation is incomplete (Fail), an erase pulse application operation is executed again (S1) without shifting to the second erase verify operation, but the erase pulse voltage Vera at that time is set not to the former value V1 but to a value stepped up from V1 by an amount of a voltage α (S4: step-up operation).

On the other hand, when the first erase verify operation judges the erase operation to be completed (Pass), the second erase verify operation is executed (S5). FIG. 12 illustrates by example the case where the first erase verify operation has judged "Fail" after a first time and a second time of the erase pulse application operation, the second erase verify operation is not performed (is omitted).

When a judgment result of the second erase verify operation is "Pass", the erase operation finishes (END). On the other hand, when the judgment result of the second erase verify operation is "Fail", the step-up width in the step-up operation is set not to the voltage α but to a value smaller than this, for example, α/2 (S7), and then the erase pulse application operation (S8) is executed. It is also possible to set the step-up width to zero, instead of the step-up width being set to α/2.

This fourth embodiment also allows similar advantages to those of the first embodiment to be displayed. In addition, because the first erase verify operation is omitted according to the result of the erase verify operation, this fourth embodiment enables time required for the erase operation to be reduced compared to the first embodiment.

[Fifth Embodiment]

Figure 14:
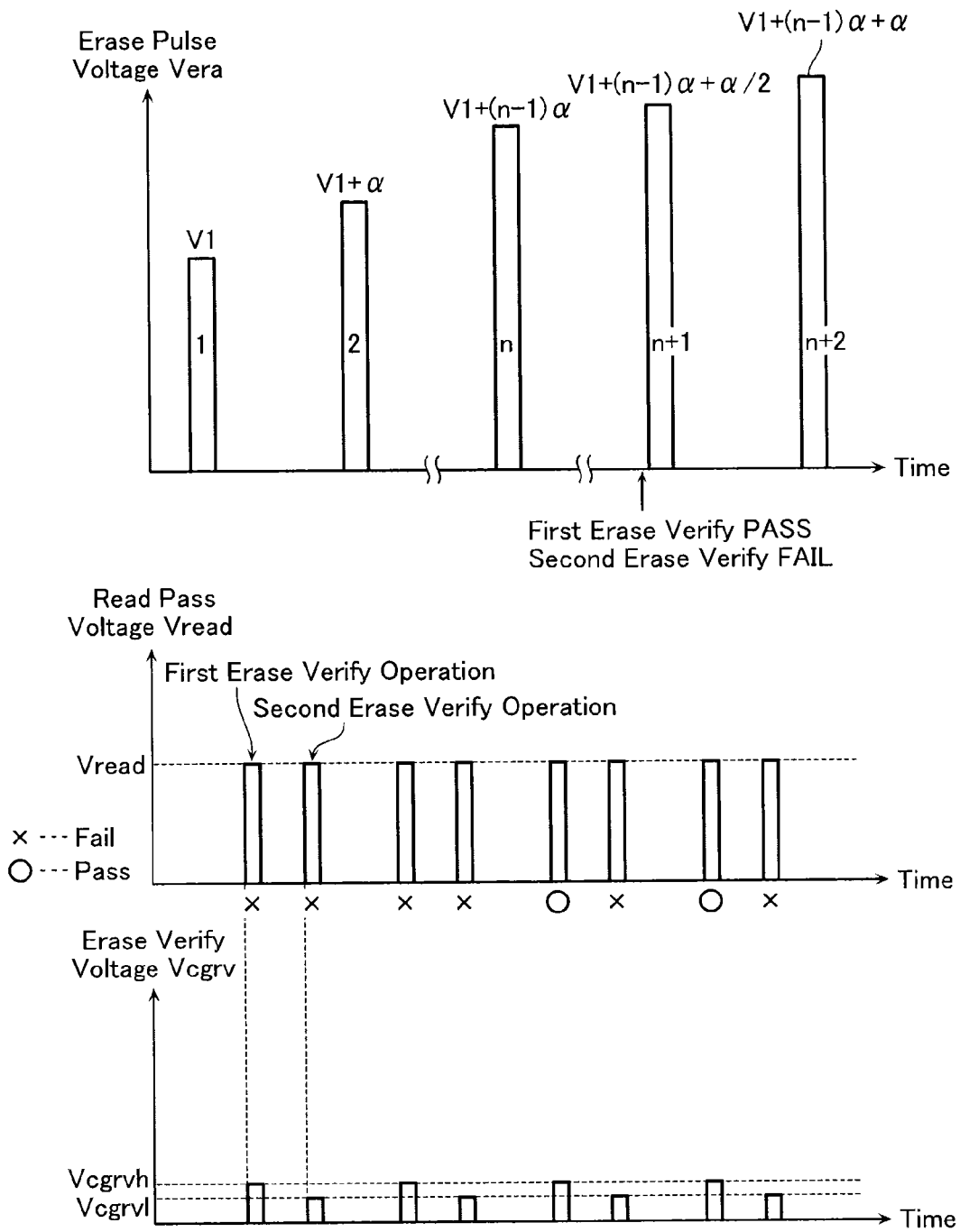
FIG. 14 is a graph showing a specific procedure of an erase operation according to a fifth embodiment.

Next, a nonvolatile semiconductor memory device according to a fifth embodiment is described with reference to FIG. 14. A configuration of the nonvolatile semiconductor memory device in this embodiment may be similar to that of FIG. 1. However, in this embodiment, a specific procedure of the erase operation is different, hence content of a program related to the erase operation built in to the controller 4 is different.

In this fifth embodiment, similarly to in the first embodiment, the erase verify operation is executed divided into the first erase verify operation and the second erase verify operation. However, in this fifth embodiment, the read pass voltage Vread applied in the first erase verify operation and the second erase verify operation is identical. Instead, a value Vcgrvh of the erase verify voltage Vcgry employed in the first erase verify operation is set larger than a value Vcgrvl in the second erase verify operation (Vcgrvh>Vcgrvl). This enables an erase judgment condition of the first erase verify operation to be set less strictly compared to that of the second erase verify operation, similarly to in the first embodiment. The fifth embodiment can be appropriately combined with configurative elements of the first through fourth embodiments.

[Modified Example]

Figure 15:
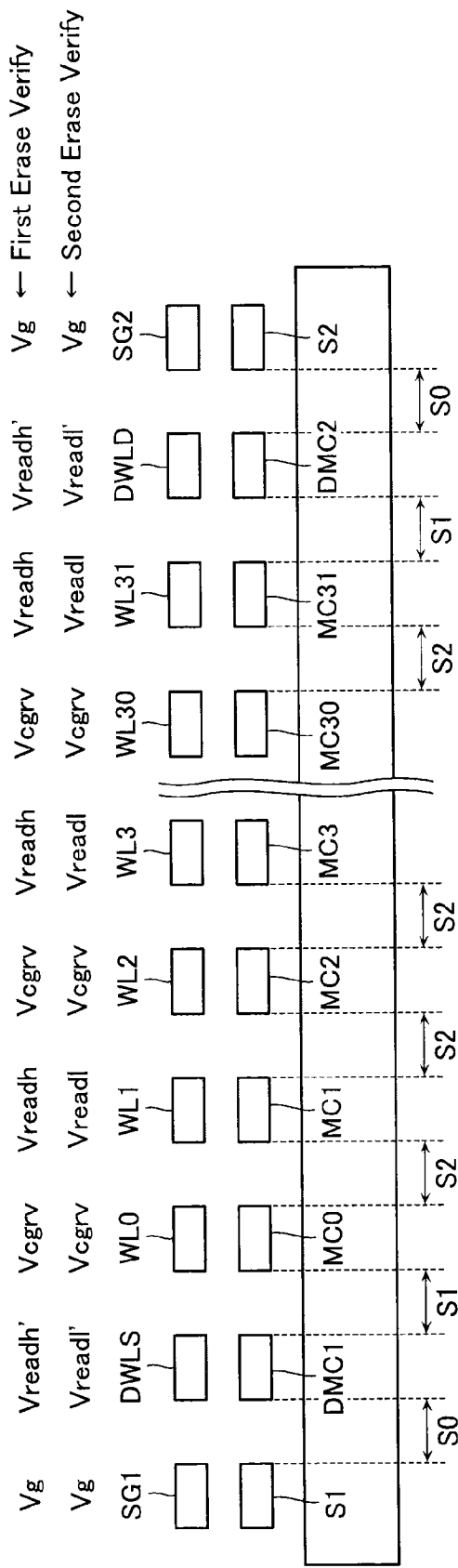
FIG. 15 shows a modified example.

Next, a modified example of the above-described embodiments is described with reference to FIG. 15. In the above-described embodiments, when executing the first erase verify operation, the dummy word lines DWLD and DWLS are applied with the voltage Vreadh identical to that applied to the word lines WL. When executing the second erase verify operation too, the dummy word lines DWLD and DWLS are applied with the voltage Vreadl identical to that applied to the word lines WL. Moreover, in the above-described embodiments, no account is taken of a spacing S0 between the dummy cell DMC1 or DMC2 and the select transistor S1 or S2, a spacing S1 between the memory cell MC and the dummy cell DMC1 or DMC2, and a spacing S2 between the memory cells MC.

On the other hand, in this modified example, voltages Vreadh' and Vreadl' applied to the dummy word lines DWLD and DWLS are set different to the voltages Vreadh and Vreadl applied to the other word lines WL. Moreover, the above-mentioned spacings S0, S1, and S2 in such a case are set different to each other.

As an example, when the voltage Vreadh' is larger than the voltage Vreadh and the voltage Vreadl' is larger than the voltage Vreadl, withstand voltage of the select transistors S1 and S2 becomes a problem. Accordingly, relationships of S0, S1, and S2 are set such that S1<S2=S3= . . . . =S31<S0. This enables advantages of the above-described embodiments to be achieved while improving withstand voltage of the select transistor S2.

Conversely, when the voltage Vreadh' is smaller than the voltage Vreadh and the voltage Vreadl' is smaller than the voltage Vreadl, withstand voltage of the memory cells MC0 and MC31 becomes a problem. Accordingly, relationships of S0, S1, and S2 are set such that S2=S3= . . . =S31<S1<S0. This enables advantages of the above-described embodiments to be achieved while improving withstand voltage of the memory cells MC. Alternatively, in a similar case, it is also possible to set relationships of S0, S1, and S2 such that S0<S2=S3= . . . =S31<S1.

The above is one example, and values of various kinds of voltages and the spacings S0~S2 can be set to various values according to an object.

[Other]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, in the above-described embodiments, memory cells that are even-numbered as viewed from the bit line BL are made read targets in the first erase verify operation, and memory cells that are odd-numbered as viewed from the bit line BL are made read targets in the second erase verify operation. Instead of this, memory cells that are odd-numbered as viewed from the bit line BL may be made read targets in the first erase verify operation, and memory cells that are even-numbered as viewed from the bit line BL may be made read targets in the second erase verify operation.

Moreover, in the above-described embodiments, the first erase verify operation and the second erase verify operation respectively adopt even-numbered memory cells and odd-numbered memory cells as read targets, but, instead of this, the half of the memory cells that are closest to the bit line BL may be made read targets in the first erase verify operation, and the half of the memory cells that are closest to the source line CELSRC may be made read targets in the second erase verify operation.

Furthermore, in the above-described embodiments, the erase operation is executed divided into the two operations of the first and second erase verify operations. However, instead of this, it is also possible to divide one erase verify operation into three or more operations.

What is claimed is:

1. A nonvolatile semiconductor memory device, comprising:
    a memory cell array configured as an arrangement of a plurality of NAND cell units, each of the NAND cell units having a plurality of memory cells connected in series therein, each of the memory cells being capable of storing an erase state where data has been erased from the memory cell and a write state where data has been written to the memory cell; and
    a control circuit configured to control an operation on the memory cell array,
    the control circuit being configured to execute an erase operation that includes: an erase pulse application operation for changing the memory cell from the write state to the erase state; and an erase verify operation for judging whether a plurality of the memory cells are in the erase state or not,
    the erase verify operation being divided into at least a first erase verify operation and a second erase verify operation,
    the first erase verify operation being an operation that applies a verify read voltage only to a first group of memory cells among the plurality of memory cells included in the NAND cell unit, and applies a first read pass voltage to memory cells other than the first group of memory cells, and
    the second erase verify operation being an operation that applies the verify read voltage to a second group of memory cells different from the first group of memory cells, and applies a second read pass voltage different from the first read pass voltage to memory cells other than the second group of memory cells.

2. The nonvolatile semiconductor memory device according to claim 1, wherein
    the first erase verify operation is an operation that applies the verify read voltage to either odd-numbered or even-numbered memory cells among the plurality of memory cells included in the NAND cell unit, and
    the second erase verify operation is an operation that applies the verify read voltage to memory cells that were not made a target of a verify operation in the first erase verify operation.

3. The nonvolatile semiconductor memory device according to claim 1, wherein
    the first erase verify operation is an operation where an erase judgment condition is less strict than that of the second erase verify operation, and
    the control unit is configured to, when it has been judged in the first erase verify operation that the erase operation has not been completed, omit execution of the second erase verify operation.

4. The nonvolatile semiconductor memory device according to claim 1, wherein
    the first erase verify operation is an operation where an erase judgment condition is less strict than that of the second erase verify operation, and
    the control unit is configured to, when it has been judged in the first erase verify operation that the erase operation has been completed and it has been judged in the second erase verify operation that the erase operation has not been completed, omit the first erase verify operation and execute only the second erase verify operation, in the erase verify operation next performed.

5. The nonvolatile semiconductor memory device according to claim 1, wherein
    the first erase verify operation is an operation where an erase judgment condition is less strict than that of the second erase verify operation, and
    the control unit is configured to, when it has been judged in the first erase verify operation that the erase operation has not been completed, omit execution of the second erase verify operation, and the control unit is configured to, when it has been judged in the first erase verify operation that the erase operation has been completed, execute the second erase verify operation, and, in the erase verify operation next performed, omit the first erase verify operation and execute only the second erase verify operation.

6. The nonvolatile semiconductor memory device according to claim 1, wherein
the control unit is configured to, when it has been judged by the erase verify operation that the erase operation has not been completed, be configured to execute a step-up operation for raising a voltage value of an erase pulse voltage applied during the erase pulse application operation by an amount of a certain step-up value, and
the control unit is configured to, when it has been judged in the first erase verify operation that the erase operation has been completed and it has been judged in the second erase verify operation that the erase operation has not been completed, stop the step-up operation or reduce the amount of the certain step-up value.

7. The nonvolatile semiconductor memory device according to claim 1, wherein
the first read pass voltage is higher than the second read pass voltage, and
the control unit is configured to, when it has been judged in the first erase verify operation that the erase operation has not been completed, omit execution of the second erase verify operation.

8. The nonvolatile semiconductor memory device according to claim 1, wherein
the first read pass voltage is higher than the second read pass voltage, and
the control unit is configured to, when it has been judged in the first erase verify operation that the erase operation has been completed and it has been judged in the second erase verify operation that the erase operation has not been completed, omit the first erase verify operation and execute only the second erase verify operation, in the erase verify operation next performed.

9. The nonvolatile semiconductor memory device according to claim 1, wherein
the first read pass voltage is higher than the second read pass voltage, and
the control unit is configured to, when it has been judged in the first erase verify operation that the erase operation has not been completed, omit execution of the second erase verify operation, and
the control unit is configured to, when it has been judged in the first erase verify operation that the erase operation has been completed, execute the second erase verify operation, and, in the erase verify operation next performed, omit the first erase verify operation and execute only the second erase verify operation.

10. The nonvolatile semiconductor memory device according to claim 6, wherein
the first erase verify operation is an operation that applies the verify read voltage to either odd-numbered or even-numbered memory cells among the plurality of memory cells included in the NAND cell unit, and
the second erase verify operation is an operation that applies the verify read voltage to memory cells that were not made a target of a verify operation in the first erase verify operation.

11. A nonvolatile semiconductor memory device, comprising:
a memory cell array configured as an arrangement of a plurality of NAND cell units, each of the NAND cell units having a plurality of memory cells connected in series therein, each of the memory cells being capable of storing an erase state where data has been erased from the memory cell and a write state where data has been written to the memory cell; and
a control circuit configured to control an operation on the memory cell array,
the control circuit being configured to execute an erase operation that includes: an erase pulse application operation for changing the memory cell from the write state to the erase state; and an erase verify operation for judging whether a plurality of the memory cells are in the erase state or not,
the erase verify operation being divided into at least a first erase verify operation and a second erase verify operation,
the first erase verify operation being an operation that applies a first verify read voltage only to a first group of memory cells among the plurality of memory cells included in the NAND cell unit, and applies a read pass voltage to memory cells other than the first group of memory cells, and
the second erase verify operation being an operation that applies a second verify read voltage different from the first verify read voltage to a second group of memory cells different from the first group of memory cells, and applies the read pass voltage to memory cells other than the second group of memory cells.

12. The nonvolatile semiconductor memory device according to claim 11, wherein
the first erase verify operation is an operation that applies the first verify read voltage to either odd-numbered or even-numbered memory cells among the plurality of memory cells included in the NAND cell unit, and
the second erase verify operation is an operation that applies the second verify read voltage to memory cells that were not made a target of a verify operation in the first erase verify operation.

13. The nonvolatile semiconductor memory device according to claim 11, wherein
the first erase verify operation is an operation where an erase judgment condition is less strict than that of the second erase verify operation, and
the control unit, when it has been judged in the first erase verify operation that the erase operation has not been completed, omits execution of the second erase verify operation.

14. The nonvolatile semiconductor memory device according to claim 11, wherein
the first erase verify operation is an operation where an erase judgment condition is less strict than that of the second erase verify operation, and
the control unit is configured to, when it has been judged in the first erase verify operation that the erase operation has been completed and it has been judged in the second erase verify operation that the erase operation has not been completed, omit the first erase verify operation and execute only the second erase verify operation, in the erase verify operation next performed.

15. The nonvolatile semiconductor memory device according to claim 11, wherein
the first erase verify operation is an operation where an erase judgment condition is less strict than that of the second erase verify operation, and the control unit is configured to, when it has been judged in the first erase verify operation that the erase operation has not been completed, omit execution of the second erase verify operation, and the control unit is configured to, when it has been judged in the first erase verify operation that the erase operation has been completed, execute the second erase verify operation, and, in the erase verify operation next performed, omit the first erase verify operation and execute only the second erase verify operation.

16. The nonvolatile semiconductor memory device according to claim 11, wherein the control unit is configured to, when it has been judged by the erase verify operation that the erase operation has not been completed, be configured to execute a step-up operation for raising a voltage value of an erase pulse voltage applied during the erase pulse application operation by an amount of a certain step-up value, and the control unit is configured to, when it has been judged by the first erase verify operation or the second erase verify operation that the erase operation has been completed in either one of the first group of memory cells or the second group of memory cells and that the erase operation has not been completed in the other of the first group of memory cells or the second group of memory cells, stop the step-up operation or reduce the certain step-up value to a smaller value.

17. The nonvolatile semiconductor memory device according to claim 11, wherein the first verify read voltage is higher than the second verify read voltage, and the control unit is configured to, when it has been judged in the first erase verify operation that the erase operation has not been completed, omit execution of the second erase verify operation.

18. The nonvolatile semiconductor memory device according to claim 11, wherein the first verify read voltage is higher than the second verify read voltage, and the control unit is configured to, when it has been judged in the first erase verify operation that the erase operation has been completed and it has been judged in the second erase verify operation that the erase operation has not been completed, omit the first erase verify operation and execute only the second erase verify operation, in the erase verify operation next performed.

19. The nonvolatile semiconductor memory device according to claim 11, wherein the first verify read voltage is higher than the second verify read voltage, and the control unit is configured to, when it has been judged in the first erase verify operation that the erase operation has not been completed, omit execution of the second erase verify operation, and when it has been judged in the first erase verify operation that the erase operation has been completed, execute the second erase verify operation, and is configured to, in the erase verify operation next performed, omit the first erase verify operation and execute only the second erase verify operation.

20. The nonvolatile semiconductor memory device according to claim 16, wherein the first erase verify operation is an operation that applies the first verify read voltage to either odd-numbered or even-numbered memory cells among the plurality of memory cells included in the NAND cell unit, and the second erase verify operation is an operation that applies the second verify read voltage to memory cells that were not made a target of a verify operation in the first erase verify operation.

* * * * *